: US010338831B2

United States Patent
Lee et al.

(10) Patent No.: US 10,338,831 B2
(45) Date of Patent: Jul. 2, 2019

(54) SYSTEM AND METHOD FOR PRESERVING DATA IN VOLATILE MEMORY

(71) Applicant: NANYA TECHNOLOGY CORPORATION, New Taipei (TW)

(72) Inventors: Chung-Hsun Lee, New Taipei (TW); Hsien-Wen Liu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 11 days.

(21) Appl. No.: 15/683,793

(22) Filed: Aug. 23, 2017

(65) Prior Publication Data

US 2019/0065079 A1 Feb. 28, 2019

(51) Int. Cl.
| | |
|---|---|
| G11C 29/52 | (2006.01) |
| G06F 3/06 | (2006.01) |
| G06F 11/20 | (2006.01) |
| G06F 11/14 | (2006.01) |
| G06F 11/16 | (2006.01) |
| G06F 11/10 | (2006.01) |
| G06F 1/24 | (2006.01) |
| G11C 11/22 | (2006.01) |

(52) U.S. Cl.
CPC .............. G06F 3/0619 (2013.01); G06F 1/24 (2013.01); G06F 3/0673 (2013.01); G06F 11/1004 (2013.01); G06F 11/1441 (2013.01); G06F 11/1666 (2013.01); G06F 11/2015 (2013.01); G11C 11/2257 (2013.01)

(58) Field of Classification Search
CPC . G11C 11/2257; G11C 11/401; G11C 11/406; G11C 29/52
USPC ....................................................... 365/228
See application file for complete search history.

(56) References Cited

U.S. PATENT DOCUMENTS

| | | | | |
|---|---|---|---|---|
| 9,741,421 | B1 * | 8/2017 | Hedden ................. | G11C 11/406 |
| 2011/0170365 | A1 * | 7/2011 | Nakanishi .............. | G11C 29/76 |
| | | | | 365/200 |
| 2014/0085995 | A1 | 3/2014 | Greenfield et al. | |
| 2015/0089183 | A1 * | 3/2015 | Bains ..................... | G06F 12/06 |
| | | | | 711/202 |

FOREIGN PATENT DOCUMENTS

TW    I544486 B    8/2016

OTHER PUBLICATIONS

Yoongu Kim et al., "Flipping Bits in Memory Without Accessing Them: An Experiment Study of Dram Disturbance Errors", 2014 ACM/IEEE 41st International Symposium on Computer Architecture (ISCA), Jun. 14-18, 2014.

* cited by examiner

*Primary Examiner* — Alexander Sofocleous
*Assistant Examiner* — Alfredo Bermudez Lozada
(74) *Attorney, Agent, or Firm* — CKC & Partners Co., LLC

(57) ABSTRACT

Present disclosure includes a system for preserving data in a volatile memory and a method thereof. The volatile memory comprises a plurality of refreshing units, and each of the refreshing units comprises a plurality of word lines for storing data. The system comprises an accessing unit. The accessing unit is configured to detect a row-hammer indication indicating a first word line is frequently accessed, wherein the accessing unit is configured to copy data stored in the first word line to a second word line when the row-hammer indication is detected on the first word line, wherein the data stored in the first and the second word lines are available to be selectively accessed.

16 Claims, 4 Drawing Sheets

SYSTEM AND METHOD FOR PRESERVING DATA IN VOLATILE MEMORY

BACKGROUND

Field of Invention

Present disclosure relates to a system and a method for preserving data in volatile memory.

Description of Related Art

Repeatedly accessing a single row in a memory may cause some side effects. Row hammer effect, or also known as one row disturb, happens when a row of the memory is frequently accessed within a refresh window. It is highly possible that data stored in the rows adjacent to the row being frequently accessed may be corrupted due to the row hammer effect. Some solutions are applied to prevent such a failure, such as limiting access times to the row in one refresh cycle or increasing the refresh rate of the memory cell. However, the solutions may cause some other problems, therefore, alternatives are required.

SUMMARY

Present disclosure relates to a system for preserving data in a volatile memory, wherein the volatile memory comprises a plurality of word lines for storing data. The system comprises an accessing unit. The accessing unit is configured to detect a row-hammer indication indicating a first word line is frequently accessed, wherein the accessing unit copies data stored in a second word line and a third word line to a fourth word line and a fifth word line respectively when the row-hammer indication is detected on the first word line, wherein the second and third word lines are adjacent to the first word line. The data stored in the fourth and the fifth word lines are available to be accessed when the data stored in the second and third word lines are found uncorrectable.

Another aspect of present disclosure is to provide a method for preserving data in a volatile memory. The volatile memory comprises a plurality of word lines for storing data. The method comprises following steps: detecting, by an accessing unit, a row-hammer indication indicating a first word line is frequently accessed; and copying, by the accessing unit, data stored in a second word line and a third word line to a fourth word line and a fifth word line respectively when the row-hammer indication is detected on the first word line, wherein the second and third word lines are adjacent to the first word line, and wherein the data stored in the fourth and the fifth word lines are available to be accessed when the data stored in the second and third word lines are found uncorrectable.

It is to be understood that both the foregoing general description and the following detailed description are by examples, and are intended to provide further explanation of the disclosure as claimed.

BRIEF DESCRIPTION OF THE DRAWINGS

Present disclosure can be more fully understood by reading the following detailed description of the embodiment, with reference made to the accompanying drawings as follows.

DETAILED DESCRIPTION

Figure 1:
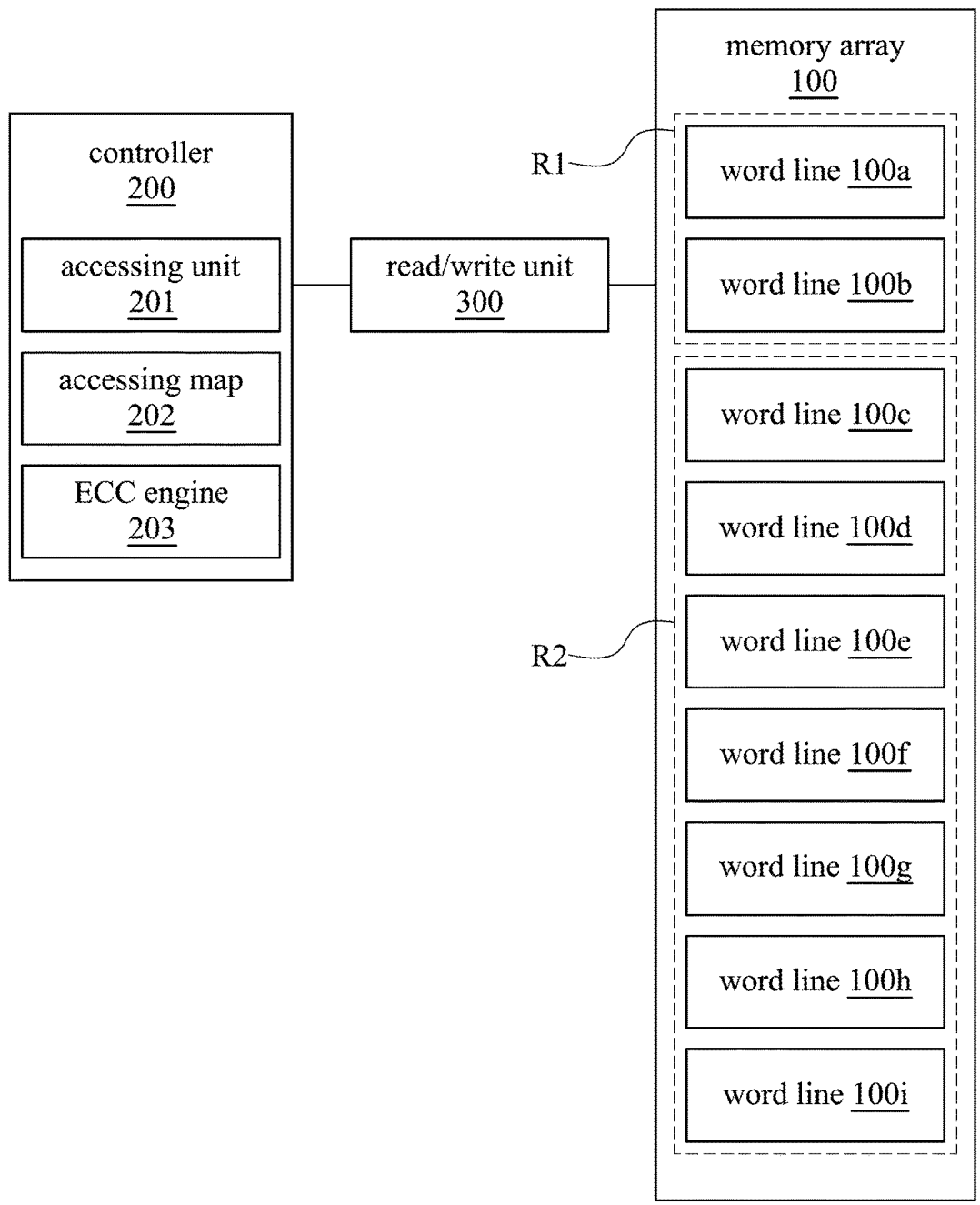
FIG. 1 is a schematic diagram of a system for preserving data in a volatile memory according to some embodiments of present disclosure.

Reference will now be made in detail to the present embodiments of the disclosure, examples of which are illustrated in the accompanying drawings. Wherever possible, the same reference numbers are used in the drawings and the description to refer to the same or like parts.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

FIG. 1 is a schematic diagram of a system for preserving data in a volatile memory according to some embodiments of present disclosure. In the embodiment, a memory array 100 is shown in FIG. 1, wherein the memory array 100 comprises several word lines 100a-100i. The word lines 100a-100b are comprised by a first refreshing unit R1, wherein the first refreshing unit R1 is provided to refresh data stored in the word lines 100a-100b according to a first cycle. The word lines 100c-100i are comprised by a second refreshing unit R2, wherein the second refreshing unit R2 is provided to refresh data stored in the word lines 100c-100i according to a second cycle. In this embodiment, the word lines 100a-100e are rows stored with data but the word lines 100f-100i are unused word lines.

As shown in FIG. 1, in the embodiment, the memory array 100 is electrically connected to a controller 200 via a read/write unit 300. The controller 200 may access the word lines 100a-100i in the memory array 100 through the read/write unit 300. The controller 200 shown in FIG. 1 comprises an accessing unit 201 and stored with an accessing map 202. The controller 200 further comprises an ECC engine 203. The accessing map 202 is a map representing relationships between logical addresses and physical addresses. Each of the word lines 100a-100i is assigned with a physical address, and the physical address is linked to a logical address. The controller 200 may access data stored in a specific word line based on logical addresses. According to the accessing map 202, when a logical address is input to the controller 200, the controller 200 may locate a physical address corresponding to the logical address and access data stored in the word line directed by the physical address via the read/write unit 300. The ECC (Error Correcting Code) engine 203 is configured to detect and correct data stored in the word lines 100a-100i. Once data failure is detected from one of the word lines 100a-100i, the ECC engine 203 may try to recover the data stored therein.

Figure 2:
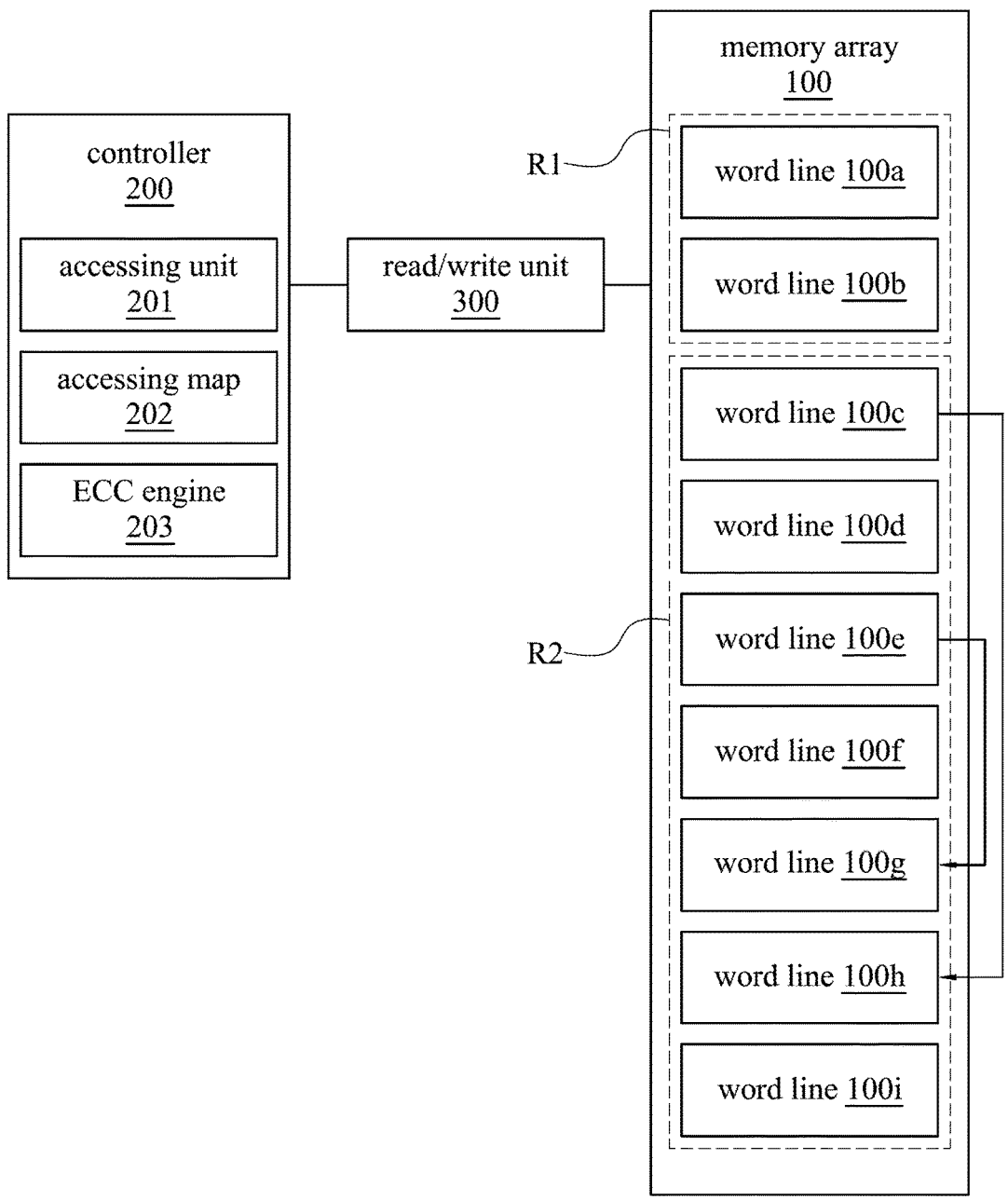
FIG. 2 is a schematic diagram of a system for preserving data in a volatile memory according to the embodiment of FIG. 1.

FIG. 2 is a schematic diagram of a system for preserving data in a volatile memory according to the embodiment of FIG. 1. In the embodiment, the accessing unit 201 is configured to detect a row-hammer indication. The row-hammer indication is to indicate whether a first word line in the memory array 100 is frequently accessed. The row-hammer indication may trigger the accessing unit 201 to copy data from two word lines adjacent to the first word line to the other two word lines. The other word lines that the data are copied thereto were unused word lines. In some embodiment, the other word lines that the data are copied thereto are adjacent to at least one unused word line, respectively. When the accessing unit 201 is triggered to copy the data stored in a specific word line to another word line, the physical address of that another word line may be linked to the logical address corresponding the specific word line as a backup. The relationship may be stored to the accessing map 202. After the relationship is built, the logical address directing to the data includes two physical addresses corresponding to the specific word line and that another word line, respectively. It is to say, after the accessing unit 201 copies the data from two word lines adjacent to the first word line to the other two word lines, backups of the data are stored in the other two word lines.

FIG. 2 is a schematic diagram of a system for preserving data in a volatile memory according to the embodiment of FIG. 1. In the embodiment, the accessing unit 201 is configured to detect a row-hammer indication with respect to the word lines 100a-100i. The row-hammer indication is determined by counting a number of each of the word lines 100a-100i has been accessed. The row-hammer indication may trigger the accessing unit 201 to copy data when the number exceeds a threshold. In the embodiment, the word line 100d is a hot row, which means data stored in the word line 100d is frequently accessed within the first cycle. It is known that the word line 100c and word line 100e are vulnerable to the row-hammer effect. In the embodiment, the accessing unit 201 may continuously count a number of word line 100d being accessed. When the number of the word line 100d being accessed exceeds the threshold, the accessing unit 201 is triggered to copy the data stored in the word line 100c to word line 100h, and copy the data stored in the word line 100e to word line 100g.

In the embodiment, the physical address of the word line 100h may be linked with the logical address corresponding to the word line 100c, and the physical address of the word line 100g may be linked with the logical address corresponding to the word line 100e. Therefore, the logical address corresponding to the word line 100c is now directed to both the word line 100c and the word line 100h. The data stored in the word line 100h is a backup of the data stored in the word line 100c. The logical address corresponding to the word line 100e is now directed to both the word line 100e and the word line 100g. The data stored in the word line 100g is a backup of the data stored in the word line 100e. The relationships may be stored in the accessing map 202. It can be seen that the word line 100g and the word line 100h were unused words line before the data are copied thereto. However, it should be understood that the embodiment is only an example of present disclosure, the word lines being used to store the data may not be limited to the word lines used in the embodiment. Other word lines in the memory array 100 are also applicable.

Figure 3:
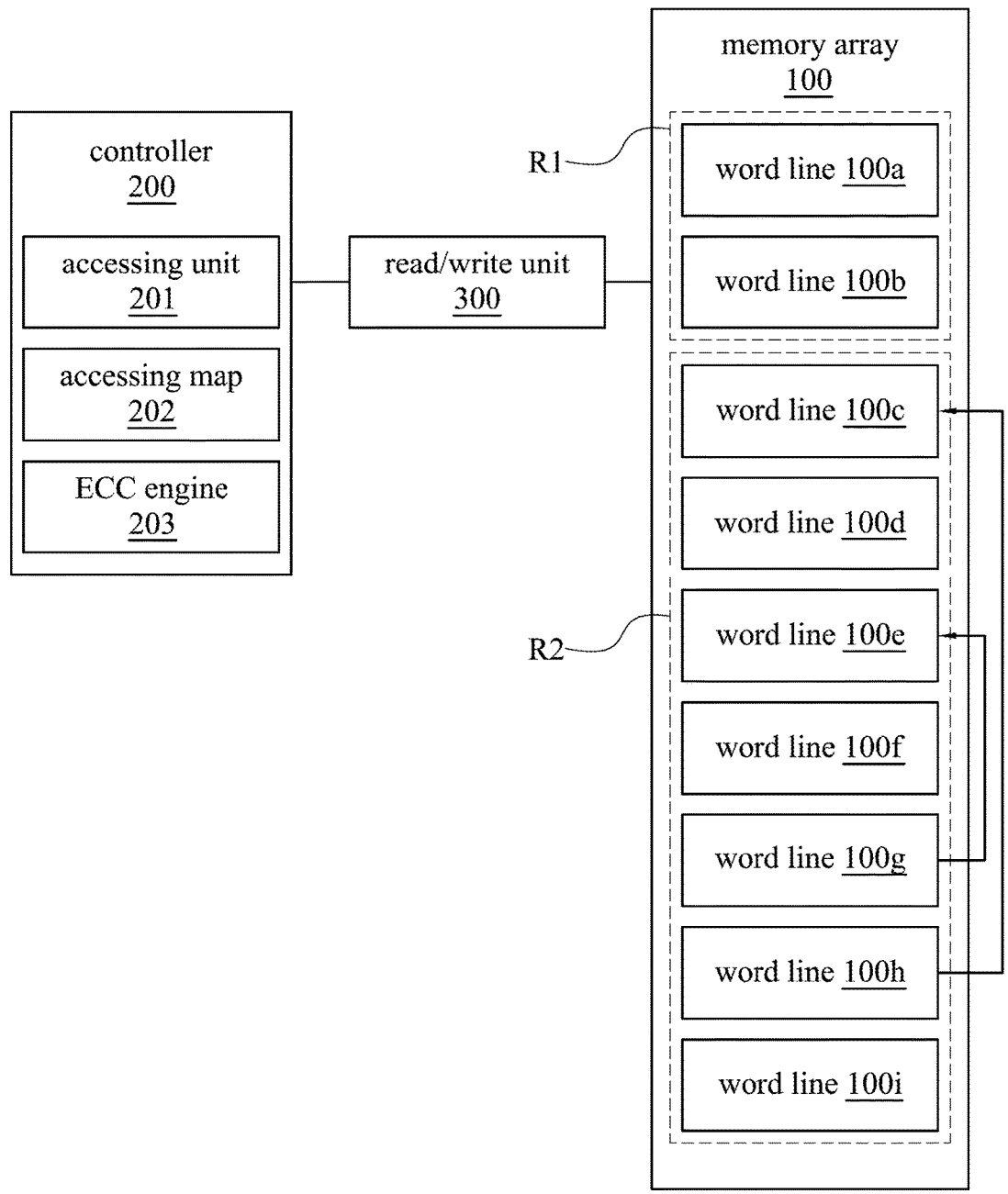
FIG. 3 is a schematic diagram of a system for preserving data in a volatile memory according to the embodiment of FIG. 2.

FIG. 3 is a schematic diagram of a system for preserving data in a volatile memory according to the embodiment of FIG. 2. As mentioned, the ECC engine 203 is configured to detect data failure happening on one of the word lines 100a-100i. When data failure is detected from one of the word lines 100a-100i, the ECC engine 203 may try to recover the data stored in that word line. The ECC engine 203 may only recover the data stored in such a word line when the data is not suffered from an uncorrectable error. When uncorrectable errors happened on one of the word lines 100a-100i, the ECC engine 203 may not recover the data successfully. However, if the uncorrectable errors are happened on the data with backups, the system of present disclosure may recover the data based on their backups. For example, as shown in FIG. 3, when the ECC engine 203 detects the word line 100c or the word line 100e is suffered from an uncorrectable error, the accessing unit 201 may overwrite the word line 100c or the word line 100e with the data stored in the line 100h or the word line 100g, respectively. As such, though the data stored in the word lines adjacent to a hot row are broken by the row-hammer effect, the accessing unit 201 may still recover them if there are backups stored in other word lines.

In some embodiment, after the accessing unit 201 overwrites the broken word lines with backup data, the physical address of where the backup data are stored may be discarded and unlinked from the corresponding logical address. For example, in aforementioned embodiment, when the ECC engine 203 detects the word line 100c is suffered from an uncorrectable error, the accessing unit 201 may overwrite the word line 100c with the data stored in the line 100h. Then, the accessing unit 201 may discard the data stored in the word line 100h and unlink the physical address of the word line 100h is from the logical address corresponding to the word line 100c in the accessing map 202. It is to say, after the data stored in the word line 100h is discarded, only the physical address of the word line 100c can be referenced from the logical address directed to the data. In the same manner, when the data stored in the word line 100g is discarded by the accessing unit 201, the physical address of the word line 100g may be unlinked from the logical address corresponding to the word line 100e in the accessing map 202. This approach saves more memory spaces of the memory array 100.

Figure 4:
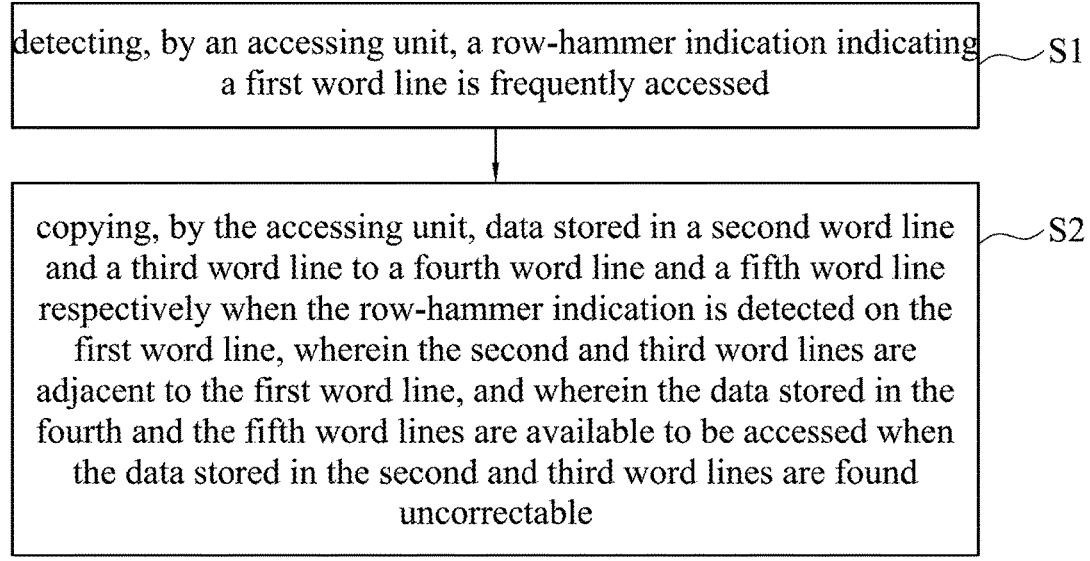
FIG. 4 is a flow chart of a method for preserving data in a volatile memory according to some embodiments of present disclosure.

FIG. 4 is a flow chart of a method for preserving data in a volatile memory according to some embodiments of present disclosure. The configuration of the volatile memory may be referenced to the embodiment shown in FIG. 1 to FIG. 3. The steps of the method will be listed and explained in detail in following segments.

Step S1: detecting, by an accessing unit, a row-hammer indication indicating a first word line is frequently accessed. As shown in the embodiments of FIG. 1 to FIG. 3, the accessing unit 201 is configured to detect the word lines 100a-100i in the memory array 100. In the embodiment, the row-hammer indication is determined by counting a number of each of the word lines 100a-100i has been accessed. When the number of one of the word lines 100a-100i exceeds a threshold, the row-hammer indication is detected by the accessing unit 201.

Step S2: copying, by the accessing unit, data stored in a second word line and a third word line to a fourth word line and a fifth word line respectively when the row-hammer indication is detected on the first word line, wherein the second and third word lines are adjacent to the first word line, and wherein the data stored in the fourth and the fifth word lines are available to be accessed when the data stored in the second and third word lines are found uncorrectable. As shown in the embodiments of FIG. 1 to FIG. 3, the accessing unit 201 detects the row-hammer indication from the word line 100d, and the accessing unit 201 copies the data stored in the word lines 100c and 100e to the word lines 100h and 100g, respectively. The physical address of the word line 100h may be linked with the logical address corresponding to the word line 100c, and the physical address of the word line 100e may be linked with the logical address corresponding to the word line 100g. The relationship may be stored in the accessing map 202.

In the embodiments, the ECC engine 203 may try to recover the data stored in the word line 100c when data failure is detected from the word line 100c. However, if the data failure detected from the word line 100c is an uncorrectable error, the ECC engine 203 may not recover the data stored therein. When uncorrectable errors happened on the word line 100c, the accessing unit 201 may overwrite the word line 100c with the data stored in the line 100h. As such, though the data stored in the word lines adjacent to a hot row are suffered from uncorrectable errors caused by the row-hammer effect, the accessing unit 201 may still recover them if there are backups stored in other word lines. Therefore, the row-hammer side effect on the word lines 100a-100i may be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A system for preserving data in a volatile memory, wherein the volatile memory comprises a plurality of word lines for storing data, wherein the system comprises:
    an accessing unit, configured to detect a row-hammer indication indicating a first word line is frequently accessed, wherein the accessing unit copies data stored in a second word line and a third word line to a fourth word line and a fifth word line respectively when the row-hammer indication is detected on the first word line, wherein the second and third word lines are adjacent to the first word line, and wherein the data stored in the fourth and the fifth word lines are available to be accessed when the data stored in the second and third word lines are found uncorrectable;
    wherein the accessing unit is further configured to overwrite the second and third word lines with the data stored in the fourth and fifth word lines respectively when the data stored in the second and third word lines are found uncorrectable.

2. The system of claim 1, wherein the row-hammer indication is determined by counting a number of times the first word line has been accessed, and wherein the row-hammer indication is detected when the number exceeds a threshold.

3. The system of claim 1, wherein the fourth and fifth word lines are unused word lines.

4. The system of claim 3, wherein the fourth and fifth word lines are redundant word lines.

5. The system of claim 1, wherein the fourth and fifth word lines are linked to logical addresses corresponding to the second and third word lines, respectively.

6. The system of claim 1, wherein the accessing unit is further configured to discard the data stored in the fourth and fifth word lines when the second and third word lines are overwritten with the data stored in the fourth and fifth word lines.

7. The system of claim 6, wherein the fourth and fifth word lines are unlinked from the logical addresses corresponding to the second and third word lines when the data stored in the fourth and fifth word lines are discarded.

8. The system of claim 1, wherein the second, third, fourth and fifth word lines are belongs to a first refreshing unit of the volatile memory.

9. A method for preserving data in a volatile memory, wherein the volatile memory comprises a plurality of word lines for storing data, wherein the method comprises:
    detecting, by an accessing unit, a row-hammer indication indicating a first word line is frequently accessed;
    copying, by the accessing unit, data stored in a second word line and a third word line to a fourth word line and a fifth word line respectively when the row-hammer indication is detected on the first word line, wherein the second and third word lines are adjacent to the first word line, and wherein the data stored in the fourth and the fifth word lines are available to be accessed when the data stored in the second and third word lines are found uncorrectable; and
    overwriting, by the accessing unit, the second and third word lines with the data stored in the fourth and fifth word lines respectively when the data stored in the second and third word lines are found uncorrectable.

10. The method of claim 9, wherein the row-hammer indication is determined by counting a number of times the first word line has been accessed, and wherein the row-hammer indication is detected when the number exceeds a threshold.

11. The method of claim 9, wherein the fourth and fifth word lines are unused word lines.

12. The method of claim 11, wherein the fourth and fifth word lines are redundant word lines.

13. The method of claim 9, further comprising:
    linking, by the accessing unit, the fourth and fifth word lines to logical addresses corresponding to the second and third word lines, respectively.

14. The method of claim 9, further comprising:
    discarding, by the accessing unit, the data stored in the fourth and fifth word lines when the second and third word lines are overwritten with the data stored in the fourth and fifth word lines.

15. The method of claim 14, further comprising:
    unlinking, by the accessing unit, the fourth and fifth word lines from the logical addresses corresponding to the second and third word lines when the data stored in the fourth and fifth word lines are discarded.

16. The method of claim 9, wherein the second, third, fourth and fifth word lines are belongs to a first refreshing unit of the volatile memory.

\* \* \* \* \*